(12) United States Patent
Tsengenes

(10) Patent No.: US 11,999,260 B2
(45) Date of Patent: Jun. 4, 2024

(54) ENERGY MONITORING SYSTEM FOR A VEHICLE

(71) Applicant: Volvo Car Corporation, Gothenburg (SE)

(72) Inventor: Georgios Tsengenes, Gothenburg (SE)

(73) Assignee: VOLVO CAR CORPORATION, Gothenburg (SE)

( * ) Notice: Subject to any disclaimer, the term of this patent is extended or adjusted under 35 U.S.C. 154(b) by 132 days.

(21) Appl. No.: 17/660,923

(22) Filed: Apr. 27, 2022

(65) Prior Publication Data

US 2022/0371471 A1 Nov. 24, 2022

(30) Foreign Application Priority Data

May 18, 2021 (EP) .................................. 21174347

(51) Int. Cl.
| | | |
|---|---|---|
| *B60L 58/15* | (2019.01) | |
| *B60L 3/00* | (2019.01) | |
| *G01R 19/165* | (2006.01) | |
| *H02J 7/00* | (2006.01) | |
| *H02J 7/34* | (2006.01) | |

(52) U.S. Cl.
CPC ............ *B60L 58/15* (2019.02); *B60L 3/0046* (2013.01); *G01R 19/16576* (2013.01); *H02J 7/00032* (2020.01); *H02J 7/0047* (2013.01); *H02J 7/345* (2013.01); *H02J 2207/20* (2020.01)

(58) Field of Classification Search
CPC .... B60L 58/15; B60L 3/0046; H02J 7/00032; H02J 7/0047; H02J 7/345; H02J 2207/20; G01R 19/16576
See application file for complete search history.

(56) References Cited

U.S. PATENT DOCUMENTS

| | | | |
|---|---|---|---|
| 2010/0096926 A1 | 4/2010 | King et al. | |
| 2011/0050174 A1 | 3/2011 | King et al. | |
| 2013/0234675 A1* | 9/2013 | King ....................... | B60L 53/24 |
| | | | 320/163 |
| 2017/0264284 A1 | 9/2017 | Xu et al. | |
| 2019/0061537 A1 | 2/2019 | Ge et al. | |
| 2019/0202300 A1* | 7/2019 | Pastor ....................... | H02J 7/04 |
| 2019/0389315 A1* | 12/2019 | Zhu ........................ | B60L 53/64 |

FOREIGN PATENT DOCUMENTS

| | | |
|---|---|---|
| EP | 1810861 A1 | 1/2007 |
| EP | 2337183 A2 | 6/2011 |

OTHER PUBLICATIONS

Extended European Search Report for European Application No. 21174347.1 dated Oct. 21, 2021, 13 pages.

* cited by examiner

*Primary Examiner* — Jared Fureman
*Assistant Examiner* — Duc M Pham
(74) *Attorney, Agent, or Firm* — Amin, Turocy & Watson, LLP

(57) ABSTRACT

The present disclosure relates to an energy monitoring system for a vehicle, a vehicle comprising such an energy monitoring system and a method for manufacturing such an energy monitoring system.
The energy monitoring system comprises an on-board battery charging system, a traction voltage system and a control unit. The traction voltage system is connected to the on-board battery charging system and the control unit is configured to transfer energy stored in the traction voltage system to the on-board battery charging system in case an energy level of the traction voltage system exceeds a defined threshold.

20 Claims, 2 Drawing Sheets

ENERGY MONITORING SYSTEM FOR A VEHICLE

CROSS-REFERENCE TO RELATED APPLICATIONS

The subject application claims priority to EP Patent Application No. EP21174347.1, entitled "Energy monitoring system for a vehicle," and filed on May 18, 2021. The respective entirety of the above noted priority application is hereby incorporated herein by reference.

TECHNICAL FIELD

The present disclosure relates to an energy monitoring system for a vehicle, a vehicle comprising such an energy monitoring system, a method for manufacturing such an energy monitoring system and a method for operating such an energy monitoring system.

BACKGROUND ART

Electric vehicles use power converters and a high voltage battery, which are connected to a traction voltage system. After a disconnection of the traction voltage system from the high voltage battery, a voltage of the traction voltage system (TVS) may not change from high value (400 V or 800 V) to a low safe value (<60 V DC) due to capacitors of the traction voltage system, which are connected between a positive rail and a negative rail inside the TVS. In order to decrease the voltage of the TVS to a safe value, a discharge system is generally applied to the traction voltage system to remove energy stored in those capacitors.

The conventional discharge system utilizes additional components such as switches and resistors to remove and/or dissipate energy stored in the traction voltage system. Alternatively, an electric drive (eDrive) and/or an electric motor (eMotor) winding is used to consume the energy stored in the traction voltage system. The first method requires more components, accordingly increases costs and weight of the system. Whereas when applying the second method, the discharge system connected to the eDrive and/or the eMotor has to be arranged in front or back side of the vehicle, which might be damaged by a crash accident.

SUMMARY

Hence, there may be a need to provide an improved energy monitoring system, which facilitates an effective energy discharge from a traction voltage system.

The problem is solved by the subject matters of the independent claims of the present disclosure, wherein further embodiments are incorporated in the dependent claims. It should be noted that the aspects of the disclosure described in the following apply to the energy monitoring system for a vehicle, the vehicle comprising such an energy monitoring system, the method for manufacturing such an energy monitoring system and the method for operating such an energy monitoring system.

According to the present disclosure, an energy monitoring system for a vehicle is presented. The energy monitoring system comprises an on-board battery charging system, a traction voltage system and a control unit. The traction voltage system is connected to the on-board battery charging system and the control unit is configured to transfer energy stored in the traction voltage system to the on-board battery charging system in case an energy level of the traction voltage system exceeds a defined threshold.

The energy monitoring system according to the present disclosure allows an efficient utilization of energy stored in the traction voltage system. The energy monitoring system thus avoids an unnecessary consumption of the energy but transfer the energy to a position where the energy may be required. Since the energy monitoring system uses existing components in the on-board battery charging system and the traction voltage system without any additional components, no extra costs and/or no additional weight may arise. Further, since a position of the on-board battery charging system is not limited, the energy monitoring system may be safely mounted at any place of the vehicle, for instance at a lateral side of the vehicle. Hence any damages of the energy monitoring system due to a vehicle accident may be reduced or even avoided.

The on-board battery charging system (OBC) may be configured to charge a battery system, preferably a high voltage battery system of the vehicle at either private or public charging stations. The on-board battery charging system may be connected to an AC power supply and it may convert AC electrical power into DC electrical power for charging the battery system. The on-board battery charging system may be configured to charge a 400V-battery providing an output direct current (DC) voltage range of about 250V to 450V and/or an 800V-battery providing an output DC voltage range up to 850V.

The traction voltage system (TVS) may be configured for joining and distributing high voltage buses to a number of different electrical components. The traction voltage system may be further configured to balance fluctuating instantaneous power on rails of the TVS and to stabilize ripple current/voltage. In other words, the traction voltage system may store and/or release energy to maintain an energy balance between the electrical components. The traction voltage system may maintain the stored energy even though the TVS is disconnected from at least one of the electrical components.

The control unit may be in communication with at least one of vehicle electronic control units and/or a measurement equipment inside the OBC such that the control unit may receive a signal for a current energy level of the TVS. The control unit may then compare whether the energy stored in the traction voltage system exceeds the defined threshold or not. The defined threshold may be a safe energy level of the TVS. The defined threshold may be a defined safe voltage of the traction voltage system. Hence, if the detected energy level, in other words, a detected voltage of the TVS is higher than the defined threshold, the control unit may initiate energy transfer from the TVS to the on-board battery charging system to reduce the energy level of the TVS below the defined safe level and to utilize the excessive energy.

In an embodiment, the energy monitoring system further comprises an energy storage system. The traction voltage system is arranged between the on-board battery charging system and the energy storage system. The energy storage system may be a high voltage battery pack, which may provide traction energy to an electric machine for an electric vehicle propulsion. The energy storage system may be coupled with the on-board battery charging system via the traction voltage system. The traction voltage system may be connected to the energy storage system when charging the energy storage system or driving the vehicle.

In case the energy storage system is disconnected from the traction voltage system, e.g. neither charging the energy storage system nor driving the vehicle, however, no energy flow between the traction voltage system and the energy storage system may be occurred. Nevertheless, the traction voltage system may still contain electrical energy. If the voltage of the traction voltage system is higher than the defined voltage in such a case, the control unit may command to transfer energy stored in the TVS to the on-board battery charging system.

For instance, the energy storage system may be powered with 400 V or 800 V. Even though the energy storage system is disconnected form the traction voltage system, the TVS may still contain energy. If the voltage of the traction TVS exceeds the defined threshold, e.g. 60 V, the control unit may transfer energy stored in the traction voltage system to the on-board battery charging system.

In an embodiment, the control unit is configured to transfer energy from the traction voltage system to the on-board battery charging system only if the energy storage system is disconnected from the traction voltage system. In other words, the energy transfer may be carried out only if the traction voltage system is operatively disconnected from the energy storage system. The traction voltage system may be operatively disconnected from the energy storage system if the energy storage system is not charged or no power is supplied from the energy storage system.

In an embodiment, the traction voltage system comprises at least one traction capacitor. The traction capacitor may be configured to store electrical energy to balance fluctuating instantaneous power on rails of the traction voltage system and to stabilize ripple current/voltage. Hence, the traction capacitor may store energy retained after a separation from the energy storage system.

In an embodiment, the control unit is further configured to monitor the energy level of the traction capacitor. In other words, the control unit may monitor and control the energy level of the stored energy in the traction capacitor. The energy level of the traction capacitor may be indicated as a voltage value and it may be same as the energy level of the traction voltage system. Accordingly, the control unit may monitor continuously if a voltage of the traction voltage system exceeds the safe energy level, i.e. defined threshold.

The control unit may further communicate with the on-board battery charging system regarding the energy level of the traction capacitor and/or traction voltage system. In an embodiment, the control unit may be integrated in the on-board battery charging system. In case the control unit receives information about a higher voltage value of the traction capacitor and/or the traction voltage system than the defined threshold and the TVS is disconnected from the energy storage system, the control unit may control to decrease the energy level of the TVS below the defined threshold by transferring electrical energy to the on-board battery charging system.

In an embodiment, the on-board battery charging system comprises a bidirectional converter unit, through which energy stored in the traction voltage system is transferred to the on-board battery charging system. The bidirectional converter unit may be configured to transfer energy from the on-board battery charging system in direction of the traction voltage system and vice versa. Accordingly, the bidirectional converter unit allows the on-board battery charging system not only to charge the energy storage system from an external energy source but also to receive the excessive energy from the traction voltage system.

In an embodiment, the bidirectional converter unit is a bidirectional DC/DC converter unit. The bidirectional DC/DC converter unit may provide energy flow in buck and boost direction and a safe energy interface between the external energy source and the energy storage system. The bidirectional DC/DC converter unit may allow the traction voltage system and/or the traction capacitor to transfer energy to the on-board battery charging system by applying a boost function of the bidirectional DC/DC converter unit.

In an embodiment, the bidirectional DC/DC converter unit may comprise an isolated DC-DC converter. The isolated DC-DC converter may be galvanically isolated.

In an embodiment, the on-board battery charging system further comprises at least one internal capacitor configured to store the energy transferred from the traction voltage system. The energy transferred from the traction voltage system may not be dissipated or unnecessarily consumed but stored in the internal capacitor of the on-board battery charging system. Accordingly, an efficient energy use may be achieved.

In an embodiment, the internal capacitor is integrated in a power factor correction unit. The power factor correction unit may be connected to an external AC charging interface and configured to vary an output voltage in a predefined range. The power factor correction unit may comprise the internal capacitor, which may store the transferred energy from the traction voltage system. In general, the internal capacitor of the power factor correction unit is big enough to eliminate or reduce a voltage ripple caused by AC power supply. Accordingly, the internal capacitor arranged in the power factor correction unit may store the transferred energy from the traction voltage system without using any additional active or passive components such as switching circuit and/or resistor for dissipating the excessive energy of the TVS.

In an embodiment, the power factor correction unit is configured to utilize the energy stored in the internal capacitor prior to initiating an AC charging. The energy stored in the internal capacitor of the power factor correction unit may bring the bidirectional converter unit potential up to a rated voltage level before starting full rectification of AC power supply. Additionally or alternatively, the energy stored in the internal capacitor may be transferred back to the energy storage system as soon as the traction voltage system and the energy storage system are connected.

In an embodiment, the on-board battery charging system is always powered on. In other words, the on-board battery charging system may be continuously powered on even though the energy storage system is disconnected and/or no energy is transferred to the traction voltage system, in case an energy level of the TVS exceeds a defined safe energy level.

According to the present disclosure, a vehicle is presented. The vehicle comprises an energy monitoring system as described above. The vehicle is a battery electric vehicle or a hybrid electric vehicle.

In an embodiment, a control unit is configured to start an energy transfer from a traction voltage system to an on-board battery charging system only if the vehicle being beyond a driving mode and a charging mode. If the energy storage system supplies power to the electric machine for electric vehicle propulsion or it is charged via the on-board battery charging system, the energy transfer in a reverse direction may not be possible. In other words, the energy transfer from the traction capacitor and/or the traction voltage system to the internal capacitor of the on-board battery charging system may be carried out only in case the TVS is operatively disconnected from the energy storage system and an energy level of the traction voltage system exceeds a defined threshold for a safe energy level.

According to the present disclosure, a method for manufacturing an energy monitoring system is presented. The method comprises, not necessarily in this order:
  providing a traction voltage system,
  providing an on-board battery charging system, and
  connecting the on-board battery charging system with the traction voltage system.
A control unit is configured to transfer energy stored in the traction voltage system to the on-board battery charging system in case a voltage of the traction voltage system exceeds a defined threshold.

According to the present disclosure, a method for operating an energy monitoring system in a vehicle is presented. The method comprises, not necessarily in this order:
  receiving information about an energy level of a traction voltage system,
  disconnecting the traction voltage system from an energy storage system,
  determining if the energy level of the energy level of the traction voltage system exceeds a defined threshold, and
  transferring energy stored in the traction voltage system to an on-board battery charging system in case an energy level of the traction voltage system exceeds the defined threshold.

Accordingly, the energy monitoring system avoids an unnecessary consumption of energy but transfers energy to a position where the energy may be required. Since the energy monitoring system use existing components of the on-board battery charging system and the traction voltage system without any additional components, no extra costs and/or no additional weight may arise.

It should be noted that the above embodiments may be combined with each other irrespective of the aspect involved. Accordingly, the method may be combined with structural features and, likewise, the system may be combined with features described above with regard to the method.

These and other aspects of the present embodiments will become apparent from and elucidated with reference to the embodiments described hereinafter.

BRIEF DESCRIPTION OF DRAWINGS

Exemplary embodiments will be described in the following with reference to the following drawings.

DESCRIPTION OF EMBODIMENTS

Figure 1:
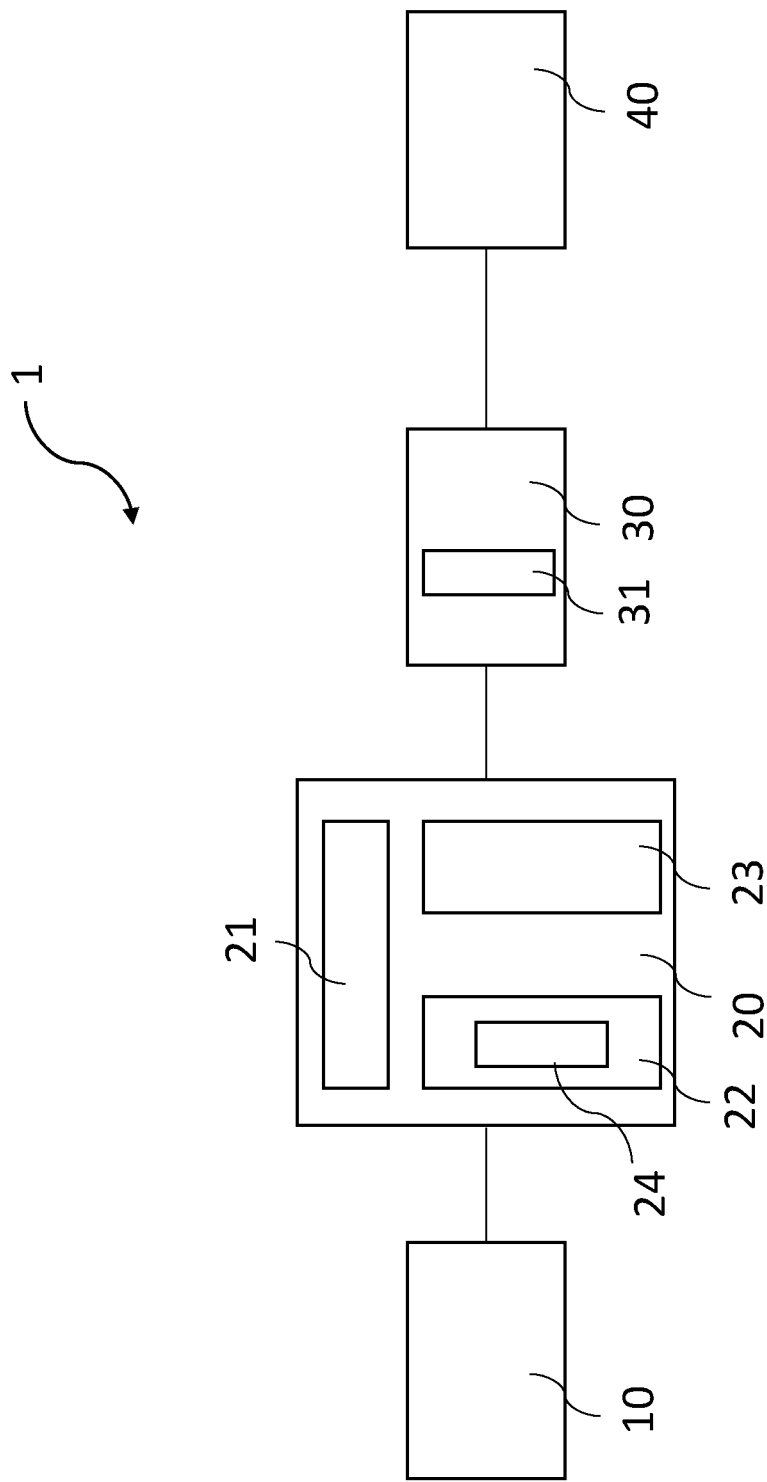
FIG. 1 shows schematically and exemplarily an embodiment of an energy monitoring system according to the present disclosure.

FIG. 1 shows an energy monitoring system 1 for a vehicle. The vehicle may be an electric vehicle such as a battery electric vehicle (BEV), a plug-in-hybrid electric vehicle (PHEV) and/or a hybrid electric vehicle (HEV).

The energy monitoring system 1 comprises an on-board battery charging system (OBC) 20, a traction voltage system (TVS) 30, an energy storage system 40 and a control unit 21. The traction voltage system 30 is connected to the on-board battery charging system 20 and also couplable with the energy storage system 40. The energy storage system 40 may be a high voltage battery pack, which may provide electrical energy to an electric machine for an electric vehicle propulsion and to auxiliary loads connected to the TVS 30.

The on-board battery charging system 20 may be configured to charge the energy storage system 40. The on-board battery charging system 20 comprises a power factor correction unit 22. The power factor correction unit 22 is connected to an external AC power supply 10 and configured to vary an output voltage in a predefined range. The power factor correction unit 22 comprises at least one internal capacitor 24, which is big enough to eliminate or reduce a voltage ripple caused by oscillations of the external AC power supply 10.

The on-board battery charging system 20 further comprises a bidirectional converter unit 23, preferably bidirectional DC/DC converter unit. The bidirectional DC/DC converter unit 23 may provide energy flow in buck and boost direction and a safe energy interface between the external AC energy source 10 and the energy storage system 40.

The traction voltage system 30 comprises at least one traction capacitor 31 configured to store electrical energy to balance fluctuating instantaneous power on rails of the TVS and to stabilize ripple current/voltage among different electrical components connected thereto. The traction voltage system 30 is connected to the energy storage system 40 during charging the energy storage system 40 or supplying power from the energy storage system 40. The traction capacitor 31 may contain electrical energy even though the traction voltage system 30 is operatively disconnected from the energy storage system 40, for instance after completion of charging the energy storage system or driving the vehicle.

The control unit 21 of the energy monitoring system 1 monitors an energy level of electrical energy stored in the traction capacitor 31, particularly if the traction voltage system 30 is disconnected from the energy storage system 40. The control unit 21 is integrated in the on-board battery charging system 20 and communicates with at least one of vehicle electronic control units and/or a measurement equipment inside the OBC to receive a signal whether the energy stored in the traction voltage system 30 exceeds a defined threshold or not. The energy level of the traction voltage system 30 may be indicated as a voltage value. The defined threshold may be a safe energy level of the traction voltage system 30.

In case the energy level of the traction capacitor 31 or the traction voltage system 30 exceeds the defined threshold, the control unit 21 prompt the on-board battery charging system 20 to transfer energy stored in the traction voltage system 30 to the OBC 20. Accordingly, even though the energy storage system 40 is in an inactive state, the bidirectional DC/DC converter unit 23, thus the on-board battery charging system 20 is always powered on.

The bidirectional DC/DC converter unit 23 enables energy flow either in buck or in boost direction such that excessive energy stored in the traction capacitor 31 may be transferred to the internal capacitor 24 of the power factor correction unit 22. Due to its big size, the internal capacitor 24 can store the transferred energy from the traction voltage system 30 without using any additional active or passive components such as switching circuit and/or resistor for dissipating the excessive energy in the TVS 30. The power factor correction unit 22 may utilize the energy stored in the internal capacitor 24 prior to initiating an AC charging.

Figure 2:
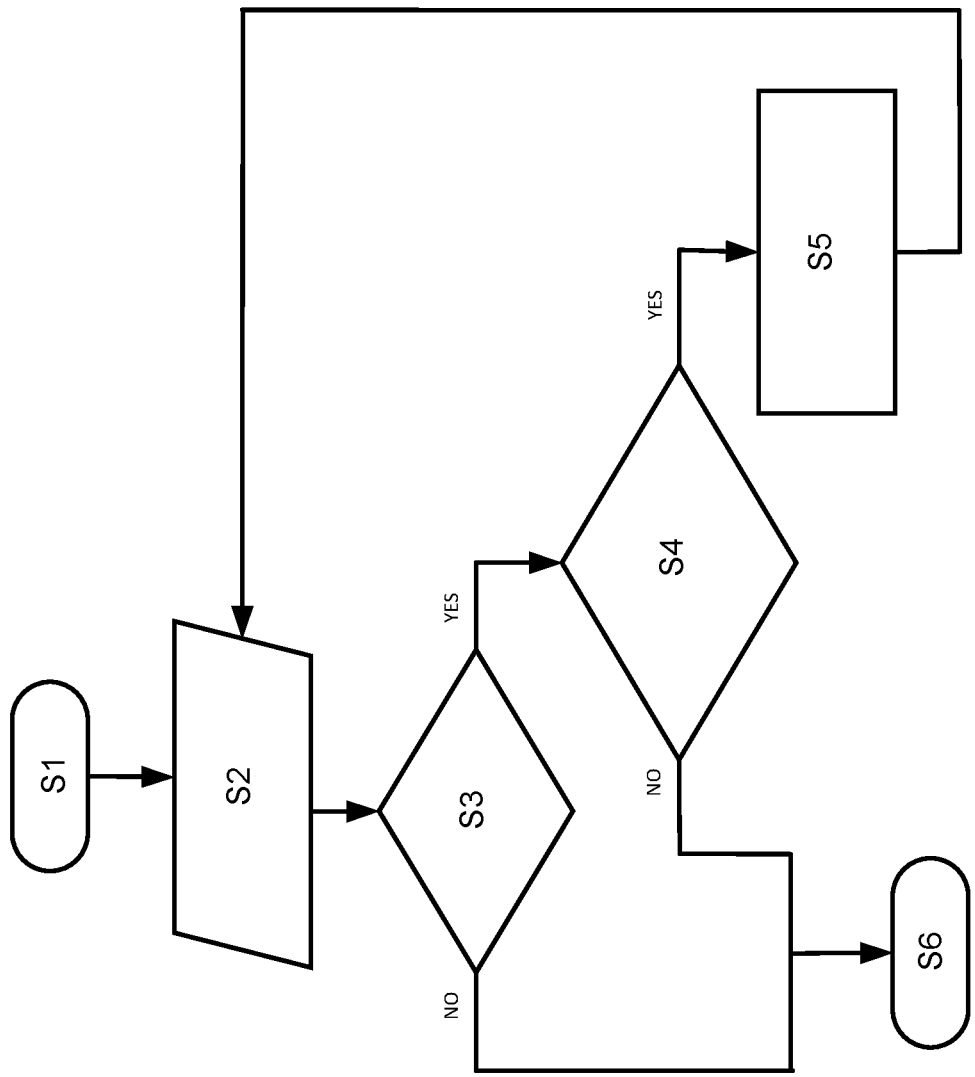
FIG. 2 shows schematically and exemplarily a flow chart diagram of a method for operating an energy monitoring system according to the present disclosure.

FIG. 2 shows a flow chart diagram of a method for operating the energy monitoring system 1. The method comprises:

S1: start;

S2: receiving information about an energy level of the traction voltage system 30;

S3: disconnecting a traction voltage system 30 from an energy storage system 40;

S4: determining if the energy level of the energy level of the traction voltage system 30 exceeds a defined threshold;

S5: transferring energy stored in the traction voltage system 30 to an on-board battery charging system 20, in case the energy level of the traction voltage system 30 exceeds the defined threshold; and S6: stop.

Preferably in the step S2, a status of the energy storage system 40 may be also measured and in the step S5, the traction capacitor 31 is discharged and the internal capacitor 24 is charged It has to be noted that embodiments of the disclosure are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the disclosure has been illustrated and described in detail in the drawings and description, such illustration and description are to be considered illustrative or exemplary and not restrictive. The disclosure is not limited to the disclosed embodiments. Other variations to the disclosed embodiments can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. An energy monitoring system for a vehicle, the energy monitoring system comprising:
    an on-board battery charging system;
    a traction inverter system, wherein the traction inverter system is connected to the on-board battery charging system; and
    a control unit configured to transfer energy stored in the traction inverter system to the on-board battery charging system in case response to determining that an energy level of the traction inverter system exceeds a defined threshold.

2. The energy monitoring system of claim 1, further comprising:
    an energy storage system, and wherein the traction inverter system is further connected to the energy storage system.

3. The energy monitoring system of claim 2, wherein the control unit is further configured to transfer energy from the traction inverter system to the on-board battery charging system only in response to determining that the energy storage system is disconnected from the traction inverter system.

4. The energy monitoring system of claim 1, wherein the traction inverter system comprises at least one traction capacitor.

5. The energy monitoring system of claim 1, wherein the control unit is further configured to monitor an energy level of the traction capacitor.

6. The energy monitoring system of claim 1, wherein the on-board battery charging system comprises a bidirectional converter unit, through which energy stored in the traction inverter system is transferred to the on-board battery charging system.

7. The energy monitoring system of claim 6, wherein the bidirectional converter unit is a bidirectional DC/DC converter unit.

8. The energy monitoring system of claim 1, wherein the on-board battery charging system further comprises:
    at least one internal capacitor, configured to store the energy transferred from the traction inverter system.

9. The energy monitoring system of claim 8, wherein the at least one internal capacitor is integrated into a power factor correction unit.

10. The energy monitoring system of claim 9, wherein the power factor correction unit is configured to utilize the energy stored in the internal capacitor prior to initiate an AC charging.

11. The energy monitoring system of claim 1, wherein the on-board battery charging system is always powered on.

12. A vehicle comprising:
    an energy monitoring system comprising:
        an on-board battery charging system;
        a traction inverter system, wherein the traction inverter system is connected to the on-board battery charging system; and
        a control unit configured to transfer energy stored in the traction inverter system to the on-board battery charging system in response to determining that an energy level of the traction inverter system exceeds a defined threshold, the vehicle being a battery electric vehicle or a hybrid electric vehicle.

13. The vehicle of claim 12, wherein the control unit is further configured to start an energy transfer from the traction inverter system to the on-board battery charging system in response to determining that an energy storage system is disconnected from the traction inverter system.

14. The vehicle of claim 12, wherein the traction inverter system comprises at least one traction capacitor.

15. The vehicle of claim 14, wherein the control unit is further configured to monitor the energy level of the traction capacitor.

16. The vehicle of claim 12, wherein the on-board battery charging system comprises a bidirectional converter unit, through which energy stored in the traction inverter system is transferred to the on-board battery charging system.

17. A method for manufacturing an energy monitoring system for a vehicle, comprising:
   providing a traction inverter system
   providing an on-board battery charging system;
   providing a control unit;
   connecting the on-board battery charging system with the traction inverter system; and
   configuring the control unit to transfer energy stored in the traction inverter system to the on-board battery charging system in response to determining that an energy level of the traction inverter system exceeds a defined threshold.

18. A method for operating an energy monitoring system in a vehicle, the method comprising:
   receiving, by a control unit, information about an energy level of a traction voltage inverter system of the energy monitoring system;
   disconnecting, by the control unit, the traction inverter system from an energy storage system of the energy monitoring system; and
   transferring, by the control unit, energy stored in the traction inverter system to an on-board battery charging system of the energy monitoring system in response to determining that an energy level of the traction inverter system exceeds a defined threshold.

19. The method of claim 18, wherein the traction inverter system comprises at least one traction capacitor.

20. The method of claim 19, further comprising monitoring, by the control unit, an energy level of the traction capacitor.

* * * * *